(12) United States Patent
Kubota (10) Patent No.: US 10,978,274 B2
(45) Date of Patent: Apr. 13, 2021

(54) PLASMA PROCESSING APPARATUS AND METHOD FOR GENERATING PLASMA

(71) Applicant: TOKYO ELECTRON LIMITED, Tokyo (JP)

(72) Inventor: Shinji Kubota, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/645,188

(22) PCT Filed: Jun. 10, 2019

(86) PCT No.: PCT/JP2019/022954
§ 371 (c)(1),
(2) Date: Mar. 6, 2020

(87) PCT Pub. No.: WO2019/244698
PCT Pub. Date: Dec. 26, 2019

(65) Prior Publication Data
US 2020/0286714 A1 Sep. 10, 2020

(30) Foreign Application Priority Data
Jun. 22, 2018 (JP) .............................. JP2018-119084

(51) Int. Cl.
*H01J 37/32* (2006.01)
(52) U.S. Cl.
CPC .. *H01J 37/32183* (2013.01); *H01J 37/32715* (2013.01); *H01J 37/32642* (2013.01); *H01J 2237/002* (2013.01); *H01J 2237/3341* (2013.01)
(58) Field of Classification Search
CPC ........... H01J 37/32183; H01J 37/32715; H01J 37/32642; H01L 21/3065; C23C 16/505
(Continued)

(56) References Cited

U.S. PATENT DOCUMENTS

| 2014/0009073 A1* | 1/2014 | Valcore, Jr. ....... | H01J 37/32183 315/183 |
| 2014/0152189 A1* | 6/2014 | Gilmore ............ | H01J 37/32183 315/224 |

(Continued)

FOREIGN PATENT DOCUMENTS

| JP | H10-241895 A | 9/1998 |
| JP | 2000-49000 A | 2/2000 |

(Continued)

OTHER PUBLICATIONS

International Search Report issued for PCT Application No. PCT/JP2019/022954 dated Aug. 27, 2019, 3 pages.

*Primary Examiner* — Binh X Tran
(74) *Attorney, Agent, or Firm* — Rothwell, Figg, Ernst & Manbeck, P.C.

(57) ABSTRACT

The plasma processing apparatus according to an exemplary embodiment includes a chamber, a radio-frequency power supply, and a correction signal generator. The radio-frequency power supply outputs a pulsed radio-frequency power in a first period. The radio-frequency power supply outputs a pulsed radio-frequency power in one or more second periods after the first period. The correction signal generator generates a correction signal that oscillates in a reverse phase with respect to a reflected wave monitor signal in the first period. The radio-frequency power supply generates a combined radio-frequency power using the correction signal. The power supply is configured to alternately repeat output of the pulsed radio-frequency power in the first period and output of the combined radio-frequency power in the one or more second periods.

10 Claims, 5 Drawing Sheets

(58) Field of Classification Search
USPC .............................................. 216/59, 61, 71
See application file for complete search history.

(56) References Cited

U.S. PATENT DOCUMENTS

| | | | | |
|---|---|---|---|---|
| 2016/0126069 A1* | 5/2016 | Kwon | ................... | H05B 31/26 |
| | | | | 315/111.21 |
| 2016/0240353 A1* | 8/2016 | Nagami | ............ | H01J 37/32568 |
| 2017/0098527 A1* | 4/2017 | Kawasaki | ......... | H01J 37/32165 |
| 2017/0365445 A1 | 12/2017 | Kubota | | |
| 2018/0330921 A1* | 11/2018 | Radomski | ......... | H01J 37/32183 |

FOREIGN PATENT DOCUMENTS

| | | |
|---|---|---|
| JP | 3629705 B2 | 3/2005 |
| JP | 2012-174736 A | 9/2012 |
| JP | 2017-228558 A | 12/2017 |
| JP | 2018-504864 A | 2/2018 |
| WO | 2017/062083 A1 | 4/2017 |

* cited by examiner

PLASMA PROCESSING APPARATUS AND METHOD FOR GENERATING PLASMA

CROSS REFERENCE TO RELATED APPLICATION

This application is a 35 U.S.C. 371 National Phase Entry Application from PCT/JP2019/022954, filed Jun. 10, 2019, which claims priority to Japanese Patent Application No. 2018-119084, filed Jun. 22, 2018, the disclosures of which are incorporated herein in their entirety by reference, and priority is claimed to each of the foregoing.

TECHNICAL FIELD

An embodiment of the present disclosure relates to a plasma processing apparatus and a method for generating plasma.

BACKGROUND

A plasma processing is performed for manufacturing electronic devices. In the plasma processing, a plasma processing apparatus is used. The plasma processing apparatus includes a chamber and a radio-frequency power supply. The radio-frequency power supply is configured to output a radio-frequency power in order to generate plasma from gas in the chamber.

In the plasma processing apparatus, a matching unit is provided between the radio-frequency power supply and a load in order to reduce reflected waves of the radio-frequency power. The matching unit is described in Patent Documents 1 to 3.

PRIOR ART DOCUMENT

Patent Document

Patent Document 1: Japanese Laid-Open Patent Publication No. 10-241895
Patent Document 2: Japanese National Phase Laid-Open Patent Publication No. 2018-504864
Patent Document 3: Specification of Japanese Patent No. 3629705

SUMMARY OF THE INVENTION

Problem to be Solved

In a plasma processing apparatus, a pulsed radio-frequency power is sometimes used in order to generate plasma. Even when the pulsed radio-frequency power is used, it is required to reduce reflected waves.

Means to Solve the Problem

According to one embodiment, a plasma processing apparatus is provided. The plasma processing apparatus includes a chamber, a radio-frequency power supply, and a correction signal generator. The radio-frequency power supply is configured to output pulsed radio-frequency power or combined radio-frequency power in order to generate plasma from gas in the chamber. The combined radio-frequency power is combined power of the pulsed radio-frequency power and correction radio-frequency power. The correction radio-frequency power is power that oscillates in a reverse phase with respect to reflected waves of the pulsed radio-frequency power. The correction signal generator is configured to generate a correction signal. The correction signal is a signal that oscillates in a reverse phase with respect to a reflected wave monitor signal representing the reflected waves of the pulsed radio-frequency power. The radio-frequency power supply is configured to output pulsed radio-frequency power in a first period. The correction signal generator is configured to generate a correction signal from the reflected wave monitor signal in the first period. The radio-frequency power supply is configured to output the combined radio-frequency power generated using the correction signal in each of one or more second periods after the first period. The radio-frequency power supply is configured to alternately repeat output of the pulsed radio-frequency power in the first period and output of the combined radio-frequency power in the one or more second periods.

Effect of the Invention

In the case where pulsed radio-frequency power is used, it is possible to reduce reflected waves.

DETAILED DESCRIPTION TO EXECUTE THE INVENTION

Hereinafter, various embodiments will be described.

According to an embodiment, a plasma processing apparatus is provided. The plasma processing apparatus includes a chamber, a radio-frequency power supply, and a correction signal generator. The radio-frequency power supply is configured to output pulsed radio-frequency power or combined radio-frequency power in order to generate plasma from gas in the chamber. The combined radio-frequency power is power obtained by combining the pulsed radio-frequency power with correction radio-frequency power. The correction radio-frequency power is power that oscillates in a reverse phase with respect to reflected waves of the pulsed radio-frequency power. The correction signal generator is configured to generate a correction signal. The correction signal is a signal that oscillates in a reverse phase with respect to a reflected wave monitor signal representing the reflected waves of the pulsed radio-frequency power. The radio-frequency power supply is configured to output pulsed radio-frequency power in a first period. The correction signal generator is configured to generate a correction signal from the reflected wave monitor signal in the first period. The radio-frequency power supply is configured to output the combined radio-frequency power generated using the correction signal in each of one or more second periods after the first period. The radio-frequency power supply is configured to alternately repeat output of the pulsed radio-frequency power in the first period and output of the combined radio-frequency power in the one or more second periods.

In the plasma processing apparatus according to an embodiment, the combined radio-frequency power is output in each of the one or more second periods. The correction radio-frequency power included in the combined radio-frequency power is generated using a correction signal that oscillates in a reverse phase with respect to the reflected wave monitor signal. Therefore, according to the plasma processing apparatus, the reflected waves are reduced in each of the one or more second periods. After the correction signal is generated by outputting the pulsed radio-frequency power in the first period, the combined radio-frequency power is generated using the correction signal in each of the one or more second periods. The first period and the one or more second periods are alternately repeated. Therefore, the combined radio-frequency power suitable for reducing the reflected waves may be updated in a timely manner.

In an embodiment, the plasma processing apparatus further includes a directional coupler. The directional coupler is provided on an electric path through which the pulsed radio-frequency power output from the radio-frequency power supply and the combined radio-frequency power are transmitted. The correction signal generator is configured to generate a correction signal from the reflected wave monitor signal output by the directional coupler. The radio-frequency power supply includes a radio-frequency signal generator, an adder, and an amplifier. The radio-frequency signal generator is configured to generate the pulsed radio-frequency signal. The adder is configured to add the correction signal to the pulse-like radio-frequency signal, thereby generating the combined radio-frequency signal. The amplifier is configured to amplify the pulsed radio-frequency signal to generate the pulsed radio-frequency power, and amplify the combined radio-frequency signal to generate the combined radio-frequency power. In the first period, the correction signal is not added to the pulsed radio-frequency signal.

In an embodiment, the first period and the one or more second periods may be respectively the same periods as a plurality of successive cycles specified by a predetermined frequency.

In an embodiment, the correction signal generator is configured to generate the correction signal by generating a reverse phase signal of the reflected wave monitor signal and correcting the reverse phase signal so as to eliminate a dependency of an amplification factor on the amplitude of an input signal of the amplifier. The amplification factor of the amplifier may have a dependency on the amplitude of the input signal, that is, an amplitude dependency of the amplification factor. According to this embodiment, the correction signal is generated such that the amplitude dependency of the amplification factor of the amplifier is canceled in advance.

In an embodiment, the plasma processing apparatus includes the radio-frequency power supply as a first radio-frequency power supply. The plasma processing apparatus further includes a support stage, a second radio-frequency power supply, and a synchronization signal generator. The support stage has a lower electrode. The support stage is configured to support a substrate thereon in the chamber. The second radio-frequency power supply is electrically connected to the support stage, and is configured to output another radio-frequency power. The frequency of the other radio-frequency power is lower than the frequency of the pulsed radio-frequency power. The synchronization signal generator is configured to generate a synchronization signal synchronized with the another radio-frequency power. The first period and the one or more second periods are respectively the same as a plurality of successive cycles of the other radio-frequency power. The first radio-frequency power supply is configured to generate the pulsed radio-frequency power in the first period according to the synchronization signal, and generate the combined radio-frequency power in each of the one or more second periods in response to the synchronization signal.

In another embodiment, there is provided a method for generating plasma in a chamber of a plasma processing apparatus. The method includes the steps of (i) outputting pulsed radio-frequency power in a first period in order to generate plasma from s gas in the chamber; (ii) generating a correction signal that oscillates in a reverse phase with respect to a reflected wave monitor signal representing reflected waves of the pulsed radio-frequency power; and (iii) outputting s combined radio-frequency power in each of one or more second periods after the first period in order to generate plasma from the gas in the chamber. The combined radio-frequency power is a power obtained by combining the pulsed radio-frequency power with a correction radio-frequency power. The correction radio-frequency power is power that oscillates in a reverse phase with respect to the reflected waves of the pulsed radio-frequency power. The correction radio-frequency power is generated using the correction signal. The step of outputting the pulsed radio-frequency power and the step of outputting the combined radio-frequency power are executed such that the output of the pulsed radio-frequency power in the first period and the output of the combined radio-frequency power in the one or more second periods are alternately repeated.

Hereinafter, various embodiments will be described in detail with reference to the accompanying drawings. In each drawing, the same or corresponding components will be denoted by the same reference numerals.

Figure 1:
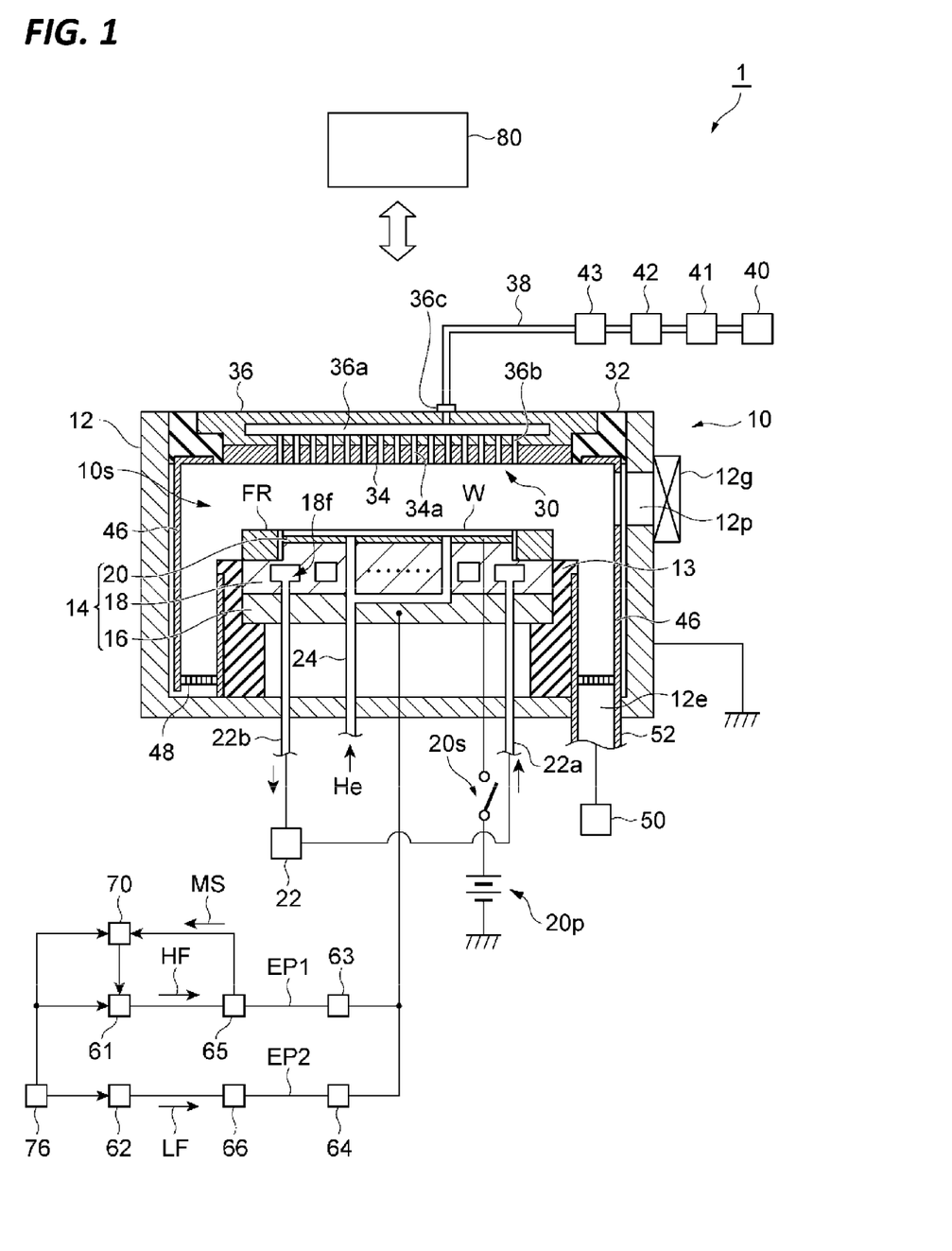
FIG. 1 is a view schematically illustrating a plasma processing apparatus according to an embodiment.

FIG. 1 is a view schematically illustrating a plasma processing apparatus according to an embodiment. The plasma processing apparatus 1 illustrated in FIG. 1 is a capacitively coupled plasma etching apparatus. The plasma processing apparatus 1 includes a chamber 10. The chamber 10 provides an internal space 10s therein.

The chamber 10 includes a chamber body 12. The chamber body 12 has a substantially cylindrical shape. The inner space 10s of the chamber 10 is provided inside the chamber body 12. The chamber body 12 is made of, for example, aluminum. A corrosion-resistant film is provided on the inner wall surface of the chamber body 12. The corrosion-resistant film may be a film formed of ceramic such as, for example, aluminum oxide or yttrium oxide.

A passage 12p is formed in the side wall of the chamber body 12. A substrate W passes through the passage 12p when being transported between the inner space 10s and the outside of the chamber 10. The passage 12p is configured to be capable of being opened/closed by a gate valve 12g. The gate valve 12g is provided along the side wall of the chamber body 12.

A support unit 13 is provided on the bottom portion of the chamber body 12. The support unit 13 is formed of an insulating material. The support unit 13 has a substantially cylindrical shape. The support unit 13 extends upward from the bottom portion of the chamber body 12 within the internal space 10s. The support unit 13 supports a support stage 14. The support stage 14 is provided in the internal space 10s. The support stage 14 is configured to support a substrate W thereon within the chamber 10, i.e. within the internal space 10s.

The support stage 14 has a lower electrode 18 and an electrostatic chuck 20. The support stage 14 may further include an electrode plate 16. The electrode plate 16 is formed of a conductor such as, for example, aluminum, and substantially disk-shaped. The lower electrode 18 is provided on the electrode plate 16. The lower electrode 18 is formed of a conductor such as, for example, aluminum, and substantially disk-shaped. The lower electrode 18 is electrically connected to the electrode plate 16.

The electrostatic chuck 20 is provided on the lower electrode 18. A substrate W is placed on the upper surface of the electrostatic chuck 20. The electrostatic chuck 20 has a main body and an electrode. The main body of the electrostatic chuck 20 is substantially disk-shaped, and formed of a dielectric material. The electrode of the electrostatic chuck 20 is a film-type electrode, and is provided in the main body of the electrostatic chuck 20. The electrode of the electrostatic chuck 20 is connected to a direct current (DC) power supply 22 via a switch 20s. When a voltage from a DC power supply 22 is applied to the electrode of the electrostatic chuck 20, an electrostatic attractive force is generated between the electrostatic chuck 20 and the substrate W. Due to the generated electrostatic attractive force, the substrate W is attracted to the electrostatic chuck 20 and held by the electrostatic chuck 20.

A focus ring FR is disposed at the peripheral edge of the lower electrode 18 so as to surround the edge of the substrate W. The focus ring FR is provided in order to improve the in-plane uniformity of a plasma processing on the substrate W. The focus ring FR may be formed of, but not limited to, silicon, silicon carbide, or quartz.

A flow path 18f is provided inside the lower electrode 18. A heat exchange medium (e.g., a coolant) is supplied to the flow path 18f from a chiller unit 22 provided outside the chamber 10 via a pipe 22a. The heat exchange medium supplied to the flow path 18f is returned to the chiller unit via a pipe 22b. In the plasma processing apparatus 1, the temperature of the substrate W disposed on the electrostatic chuck 20 is adjusted by heat exchange between the heat exchange medium and the lower electrode 18.

The plasma processing apparatus 1 is provided with a gas supply line 24. The gas supply line 24 supplies a heat transfer gas (e.g., He gas) from a heat transfer gas supply mechanism to a gap between the upper surface of the electrostatic chuck 20 and the rear surface of the substrate W.

The plasma processing apparatus 1 further includes an upper electrode 30. The upper electrode 30 is provided above the support stage 14. The upper electrode 30 is supported in the upper portion of the chamber body 12 via a member 32. The member 32 is formed of a material having an insulating property. The upper electrode 30 and the member 32 close the upper opening of the chamber body 12.

The upper electrode 30 may include a ceiling plate 34 and a support 36. The lower surface of the ceiling plate 34 is the lower surface on the internal space 10s side, and defines the internal space 10s. The ceiling plate 34 may be formed of a low-resistance conductor or semiconductor having low Joule heat. The ceiling plate 34 is provided with a plurality of gas ejection holes 34a. The plurality of gas ejection holes 34a penetrate the ceiling plate 34 in the thickness direction thereof.

The support 36 is a component that detachably supports the top plate 34. The support 36 is made of a conductive material such as, for example, aluminum. A gas diffusion chamber 36a is provided inside the support 36. A plurality of gas holes 36b are formed in the support 36. The plurality of gas holes 36b extend downward from the gas diffusion chamber 36a. The plurality of gas holes 36b communicate with the plurality of gas ejection holes 34a, respectively. A gas inlet 36c is formed in the support 36. The gas inlet 36c is connected to the gas diffusion chamber 36a. A gas supply pipe 38 is connected to the gas inlet 36c.

A gas source group 40 is connected to the gas supply pipe 38 via a valve group 41, a flow rate controller group 42, and a valve group 43. The gas source group 40 includes a plurality of gas sources. Each of the valve group 41 and the valve group 43 includes a plurality of opening/closing valves. The flow rate controller group 42 includes a plurality of flow rate controllers. Each of the plurality of flow rate controllers of the flow rate controller group 42 is a mass flow controller or a pressure control-type flow rate controller. Each of the gas sources of the gas source group 40 is connected to the gas supply pipe 38 via a corresponding opening/closing valve in the valve group 41, a corresponding flow rate controller in the flow rate controller group 42, and a corresponding opening/closing valve in the valve group 43.

In the plasma processing apparatus 1, a shield 46 is detachably installed along the inner wall surface of the chamber body 12. The shield 46 is also installed on the outer periphery of the support unit 13. The shield 46 suppresses etching byproducts from adhering to the chamber body 12. The shield 46 is constituted by forming a corrosion-resistant film on the surface of a member formed of, for example, aluminum. The corrosion-resistant film may be a film formed of ceramic such as, for example, yttrium oxide.

A baffle plate 48 is provided between the support unit 13 and the side wall of the chamber body 12. The baffle plate 48 is constituted by forming a corrosion-resistant film on the surface of a member formed of, for example, aluminum. The corrosion-resistant film may be a film formed of ceramic such as, for example, yttrium oxide. A plurality of through holes are formed in the baffle plate 48. An exhaust port 12e is provided below the baffle plate 48 and in the bottom portion of the chamber body 12. An exhaust apparatus 50 is connected to the exhaust port 12e via an exhaust pipe 52. The exhaust apparatus 50 includes a pressure regulation valve and a vacuum pump such as, for example, a turbo molecular pump.

The plasma processing apparatus 1 further includes a radio-frequency power supply 61. The radio-frequency power supply 61 is an example of a first radio-frequency power supply. The radio-frequency power supply is configured to output radio-frequency power HF in order to generate plasma from gas in the chamber 10. The basic frequency of the radio-frequency power HF is, for example, a frequency in the range of 27 MHz to 100 MHz. In an example, the basic frequency of the radio-frequency power HF is 40.86 MHz.

The radio-frequency power supply 61 is electrically connected to the lower electrode 18 via a matcher 63. The matcher 63 includes a matching circuit 63a. The matching circuit of the matcher 63 is configured to match the impedance on the load side (the lower electrode side) of the radio-frequency power supply 61 with the output impedance of the radio-frequency power supply 61. In another embodiment, the radio-frequency power supply 61 may be electrically connected to the upper electrode 30 via the matcher 63.

In an embodiment, the plasma processing apparatus 1 may further include a directional coupler 65. The directional coupler 65 is provided on an electric path EP1. The radio-frequency power HF is output by the radio-frequency power supply 61 and transmitted on the electric path EP1. In an embodiment, the directional coupler 65 is provided between the radio-frequency power supply 61 and the matcher 63. The directional coupler 65 branches some of the reflected waves of the radio-frequency power HF from the electric path EP1. The directional coupler 65 outputs some of the reflected waves as a reflected wave monitor signal MS.

In an embodiment, the plasma processing apparatus 1 may further include a radio-frequency power supply 62. The radio-frequency power supply 62 is an example of a second radio-frequency power supply. The radio-frequency power supply 62 is configured to output radio-frequency power LF. The radio-frequency power LF mainly has a frequency suitable for attracting ions into a substrate W. The basic frequency of the radio-frequency power LF is, for example, a frequency in the range of 400 kHz to 13.56 MHz. In an example, the basic frequency of the radio-frequency power LF is 400 kHz.

The radio-frequency power supply 62 is electrically connected to the lower electrode 18 via a matcher 64. The matcher 64 includes a matching circuit 63a. The matching circuit of the matcher 64 is configured to match the impedance on the load side (the lower electrode side) of the radio-frequency power supply 62 with the output impedance of the radio-frequency power supply 62.

In an embodiment, the plasma processing apparatus 1 may further include a directional coupler 66. The directional coupler 66 is provided on an electric path EP2. The radio-frequency power LF is output by the radio-frequency power supply 62 and transmitted on the electric path EP2. In an embodiment, the directional coupler 66 is provided between the radio-frequency power supply 62 and the matcher 64. The directional coupler 66 branches some of the reflected waves of the radio-frequency power LF from the electric path EP2. The directional coupler 66 outputs some of the reflected waves as a reflected wave monitor signal. The reflected wave monitor signal from the directional coupler 66 is used, for example, for power control of the radio-frequency power LF.

The plasma processing apparatus 1 may further include a controller 80. The controller 80 may be a computer including, for example, a processor, a storage unit such as, for example, a memory, an input device, a display device, and a signal input/output interface. The controller 80 controls each unit of the plasma processing apparatus 1. In the controller 80, an operator is capable of performing, for example, a command input operation in order to manage the plasma processing apparatus 1 using the input device. In addition, in the controller 80, the operating situation of the plasma processing apparatus 1 may be visualized and displayed by the display device. In addition, a control program and recipe data are stored in the storage unit of the controller 80. The control program is executed by the processor of the control unit 80 in order to execute various processings in the plasma processing apparatus 1. The method MT to be described later is executed in the plasma processing apparatus 1 when the processor of the controller 80 executes the control program to control each unit of the plasma processing apparatus 1 according to the recipe data.

Figure 2:
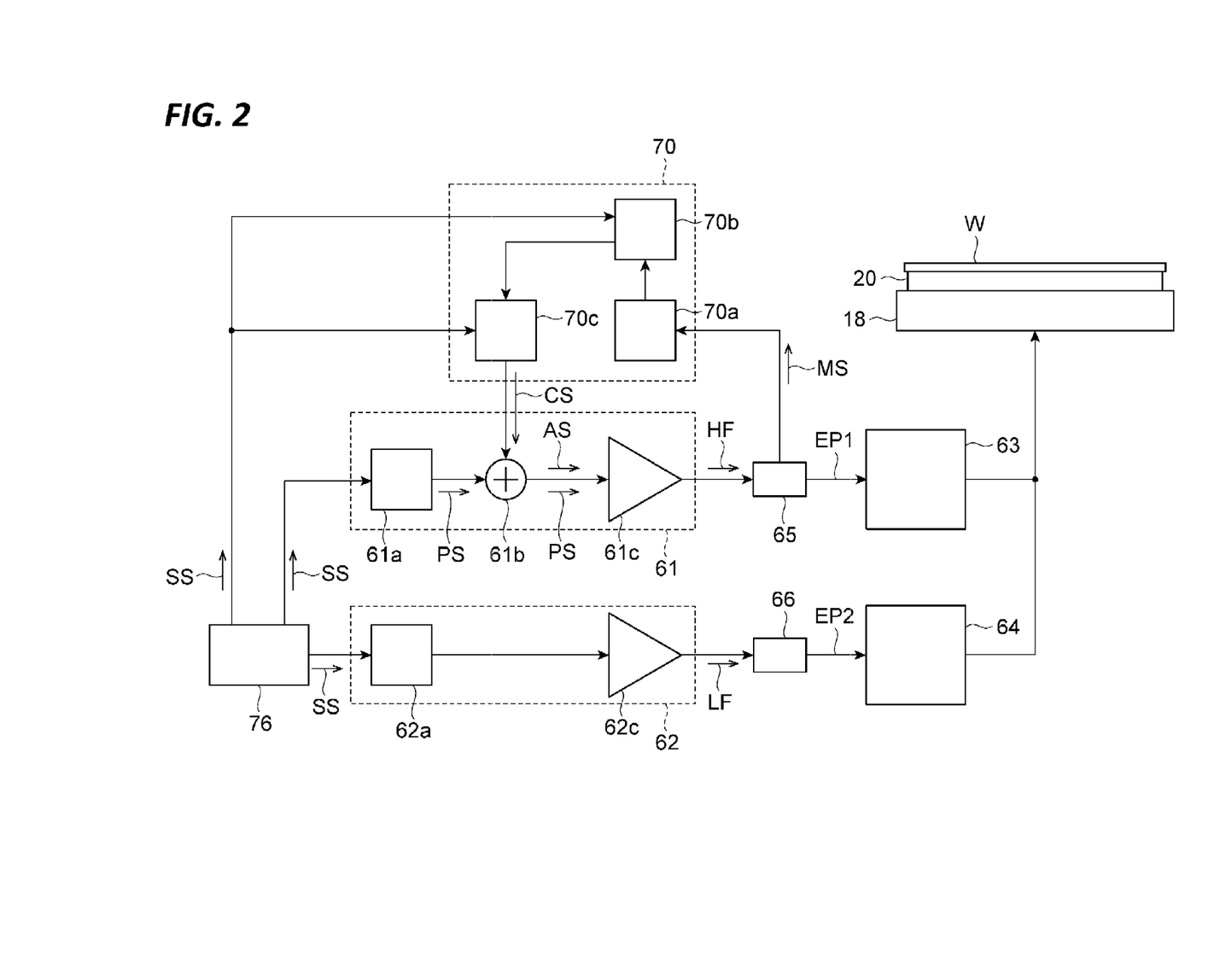
FIG. 2 is a view illustrating an exemplary configuration of a radio-frequency power supply of the plasma processing apparatus illustrated in FIG. 1 and an exemplary configuration of a correction signal generator.
Figure 3:
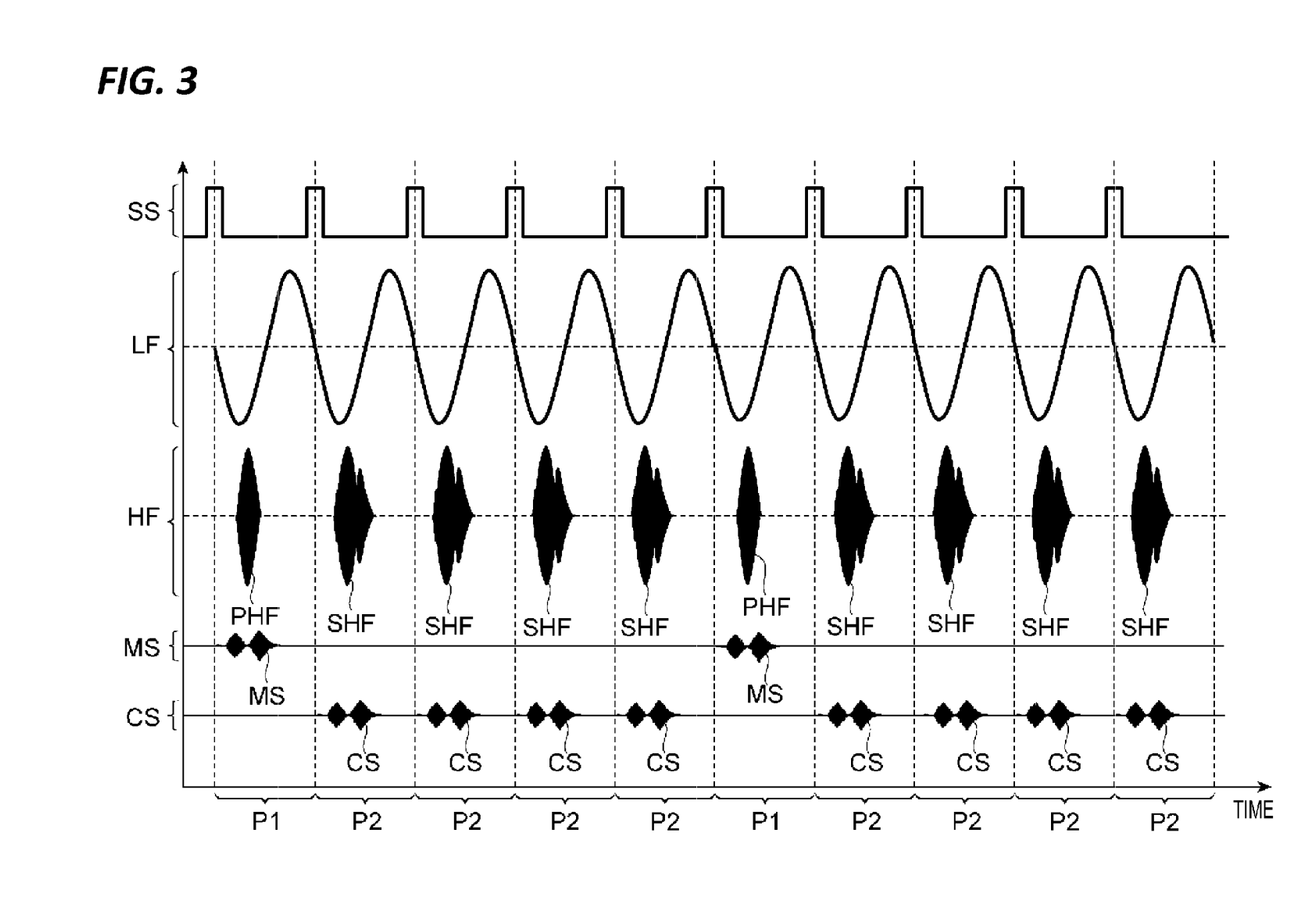
FIG. 3 is a view illustrating an exemplary timing chart related to the generation of plasma in the plasma processing apparatus illustrated in FIG. 1.
Figure 4:
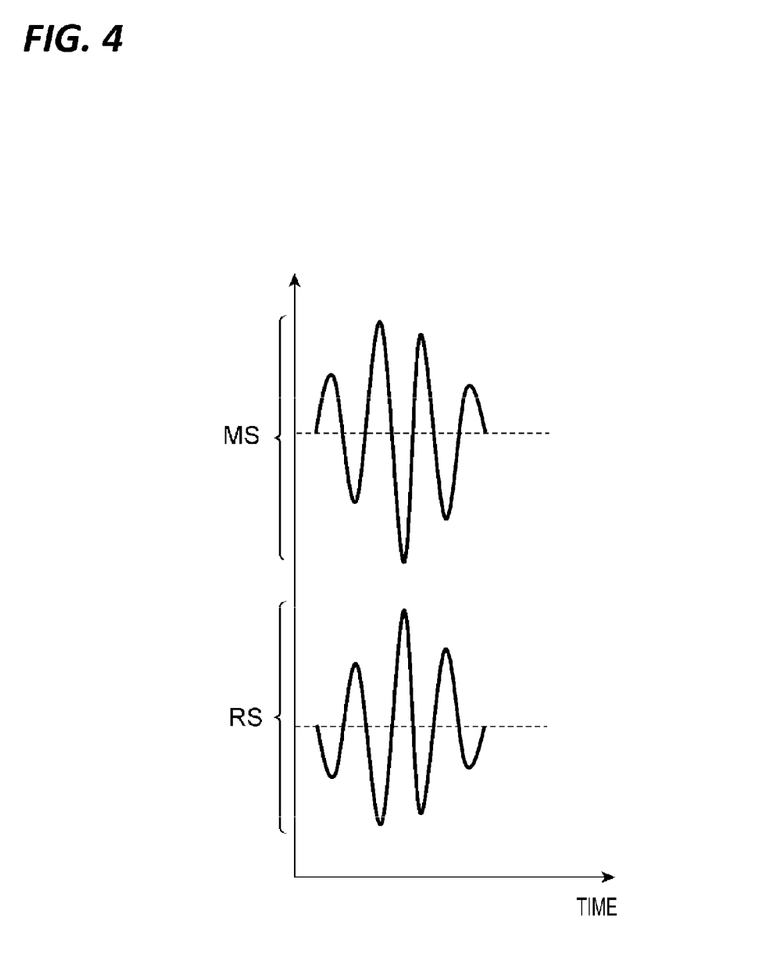
FIG. 4 is a view illustrating an exemplary reflected wave monitor signal and an exemplary reverse signal generated in the plasma processing apparatus illustrated in FIG. 1.

Hereinafter, reference is made to FIGS. 2 to 4 in addition to FIG. 1. FIG. 2 is a view illustrating an exemplary configuration of a radio-frequency power supply of the plasma processing apparatus illustrated in FIG. 1 and an exemplary configuration of a correction signal generator. FIG. 3 is a view illustrating an exemplary timing chart related to the generation of plasma in the plasma processing apparatus illustrated in FIG. 1. FIG. 4 is a view illustrating an exemplary reflected wave monitor signal and an exemplary reverse signal generated in the plasma processing apparatus illustrated in FIG. 1.

As illustrated in FIG. 3, the radio-frequency power supply 61 is configured to output a pulsed radio-frequency power PHF or a combined radio-frequency power SHF as the radio-frequency power HF. The pulsed radio-frequency power PHF is radio-frequency power, of which the power level is set such that the power level in a predetermined period is higher than the power levels in periods before and after the period. In an example, the pulsed radio-frequency power PHF is set to an ON state during a predetermined period, and is set to an OFF state before and after the period. That is, in an example, the pulsed radio-frequency power PHF has a power level for generating plasma during a predetermined period, and is set to 0 W before and after the period.

The combined radio-frequency power SHF is a combined power of the pulsed radio-frequency power PHF and a correction radio-frequency power. The correction radio-frequency power is a power that oscillates in a reverse phase with respect to the reflected waves of the pulsed radio-frequency power PHF.

The radio-frequency power supply 61 is configured to output the pulsed radio-frequency power PHF in the first period P1. The timing at which the output of the pulsed radio-frequency power PHF starts within the first period P1 and the length of time during which the pulsed radio-frequency power PHF is output within the first period P1 are specified by the controller 80 to the radio-frequency power supply 61. The radio-frequency power supply 61 is configured to output the combined radio-frequency power SHF in each of one or more second periods P2. The one or more second periods P2 are periods after the first period P1. The one or more second periods P2 may sequentially follow the first period P1. The time length of each of the one or more second periods P2 may be the same as the length of time of the first period P1. The first period P1 and the one or more second periods P2 may be respectively the same as a plurality of successive cycles specified by a predetermined frequency.

The radio-frequency power supply 61 is configured to alternately repeat the output of the pulsed radio-frequency power PHF in the first period P1 and the output of the combined radio-frequency power SHF in the one or more second periods P2. In the example illustrated in FIG. 3, four second periods P2 follow the first period P1, but the number of second periods after the first period P1 is not limited thereto.

The radio-frequency power supply 61 is configured to generate the combined radio-frequency power SHF using the correction signal CS. The correction signal CS is generated by the correction signal generator 70. The correction signal generator 70 is configured to generate the correction signal CS from the reflected wave monitor signal MS in the first period P1. The reflected wave monitor signal MS is output by the directional coupler 65. The correction signal CS is a signal that oscillates in a reverse phase with respect to the reflected wave monitor signal MS.

In an embodiment, the correction signal generator 70 includes an A/D converter 70a, a calculator 70b, and a D/A converter 70c. The A/D converter 70a performs A/D conversion on the reflected wave monitor signal MS so as to generate a digital signal. The digital signal generated by the A/D converter 70a is provided to the calculator 70b as a reflected wave monitor digital signal. The calculator 70b is, for example, a processor. The calculator 70b generates a reverse phase signal RS of the reflected wave monitor digital signal. As illustrated in FIG. 4, the reverse phase signal RS is a signal that oscillates in a reverse phase with respect to the reflected wave monitor signal MS, and the reverse phase signal RS is obtained only by performing a 180-degree phase inversion processing on the reflected wave monitor signal MS.

In an embodiment, the correction signal CS may be an analog signal generated by D/A conversion of the reverse phase signal RS. That is, the calculator 70b may output the reverse phase signal RS as a correction digital signal. In another embodiment, the correction signal generator 70 may be configured to generate the correction signal by correcting the reverse phase signal RS. Specifically, the calculator 70b may generate the correction digital signal by correcting the amplitude of the reverse phase signal RS so as to eliminate the dependency of the amplification factor on the amplitude of the input signal of the amplifier 61c (nonlinear dependency).

The correction digital signal generated by the calculator 70b is provided to the D/A converter 70c. The D/A converter 70c performs D/A conversion on the input correction digital signal so as to generate a correction signal CS (analog signal). The correction signal CS generated by the D/A converter 70c is provided to the radio-frequency power supply 61.

The correction signal generator 70 does not provide the correction signal CS to the radio-frequency power supply 61 in the first period P1. Meanwhile, the correction signal generator 70 provides the correction signal CS to the radio-frequency power supply 61 in each of the one or more second periods P2 after the first period P1.

In an embodiment, the radio-frequency power supply 61 includes a radio-frequency signal generator 61a, an adder 61b, and an amplifier 61c. The radio-frequency signal generator 61a is configured to generate a pulsed radio-frequency signal PS. The radio-frequency signal generator 61a is, for example, a function generator. The basic frequency of the pulsed radio-frequency signal PS generated by the radio-frequency signal generator 61a is the same as the basic frequency of the radio-frequency power HF.

The radio-frequency signal generator 61a is configured to output a pulsed radio-frequency signal PS in each of the first period P1 and the one or more second periods P2. In each of the first period P1 and the one or more second periods P2, the timing at which the radio-frequency signal generator 61a starts outputting the pulsed radio-frequency signal PS is specified by the controller 80 to the radio-frequency signal generator 61a. In addition, in each of the first period P1 and the one or more second periods P2, the length of time for which the radio-frequency signal generator 61a outputs the pulsed radio-frequency signal PS is specified by the controller 80 to the radio-frequency signal generator 61a.

The adder 61b receives the pulsed radio-frequency signal PS from the radio-frequency signal generator 61a. In addition, the adder 61b receives the correction signal CS from the correction signal generator 70. The adder 61b is configured to add the correction signal CS to the pulsed radio-frequency signal PS and generate a combined radio-frequency signal AS. When the correction signal CS is not provided, the adder 61b outputs the pulsed radio-frequency signal PS. The amplifier 61c is configured to generate a pulsed radio-frequency power PHF by amplifying the pulsed radio-frequency signal PS. In addition, the amplifier 61c is configured to generate a combined radio-frequency power SHF by amplifying the combined radio-frequency signal AS.

In an embodiment, the radio-frequency power supply 62 includes a radio-frequency signal generator 62a and an amplifier 62c. The radio-frequency signal generator 62a is configured to generate a radio-frequency signal. The radio-frequency signal generator 62a is, for example, a function generator. The basic frequency of the radio-frequency signal generated by the radio-frequency signal generator 62a is the same as the basic frequency of the radio-frequency power LF. The amplifier 62c generates radio-frequency signal LF from the radio-frequency signal generator 62a so as to generate radio-frequency power LF. The radio-frequency signal generator 62a may continuously generate a radio-frequency signal. That is, the radio-frequency power supply 62 may continuously output the radio-frequency power LF. Alternatively, the radio-frequency signal generator 62a may generate a pulsed radio-frequency signal. That is, the radio-frequency power supply 62 may output the pulsed radio-frequency power LF.

In an embodiment, as illustrated in FIG. 3, the first period P1 and the one or more second periods P2 are respectively the same as a plurality of successive cycles of the radio-frequency power LF. That is, the output of each of the pulsed radio-frequency power PHF and the combined radio-frequency power SHF is performed within a corresponding cycle of the radio-frequency power LF. Therefore, in an embodiment, the plasma processing apparatus 1 may further include a synchronization signal generator 76.

The synchronization signal generator 76 generates a synchronization signal SS and outputs the synchronization signal SS. The synchronization signal SS includes, for example, a synchronization pulse at the start of each cycle of the radio-frequency power LF. The radio-frequency power supply 62 outputs the radio-frequency power LF such that each cycle is synchronized with the synchronization signal SS (the synchronization pulse thereof) provided from the synchronization signal generator 76.

The synchronization signal is also provided to the correction signal generator 70 and the radio-frequency power supply 61. In each of the second periods P2, the correction signal generator 70 outputs the correction signal CS to the radio-frequency power supply 61 at a timing specified by a delay time provided from the controller 80 with reference to the synchronization pulse of the synchronization signal SS. The radio-frequency signal generator 61a of the radio-frequency power supply 61 initiates the output of the radio-frequency signal PS performs the timing specified by the delay time provided from the controller 80 with reference to the synchronization pulse of the synchronization signal SS in each of the first period P1 and the second periods P2.

According to the plasma processing apparatus 1 described above, the combined radio-frequency power SHF is output in each of the one or more second periods P2. The correction radio-frequency power included in the combined radio-frequency power SHF is generated using a correction signal CS that oscillates in a reverse phase with respect to a reflected wave monitor signal MS. Therefore, according to the plasma processing apparatus 1, the reflected waves are reduced in each of the one or more second periods P2. After the correction signal CS is generated by outputting the pulsed radio-frequency power PHF in the first period P1, the combined radio-frequency power SHF is generated using the correction signal CS in each of the one or more second periods. The first period P1 and the one or more second periods P2 are alternately repeated. Therefore, the plasma processing apparatus 1 may update the combined radio-frequency power SHF suitable for reducing the reflected waves in a timely manner.

In an embodiment, as described above, a correction signal CS is generated such that the amplitude dependency (non-linear dependency) of the amplification factor of the amplifier 61c is canceled in advance. According to this embodiment, reflected waves can be further reduced. In addition, the correction signal CS may be used for generating combined radio-frequency power SHF in a delay time adjusted so as to cancel the reflected waves with respect to pulsed radio-frequency power PHF. In an embodiment, the correction signal CS may be added to a pulsed radio-frequency signal PS in a delay time adjusted so as to cancel the reflected waves with respect to pulsed radio-frequency power PHF.

Figure 5:
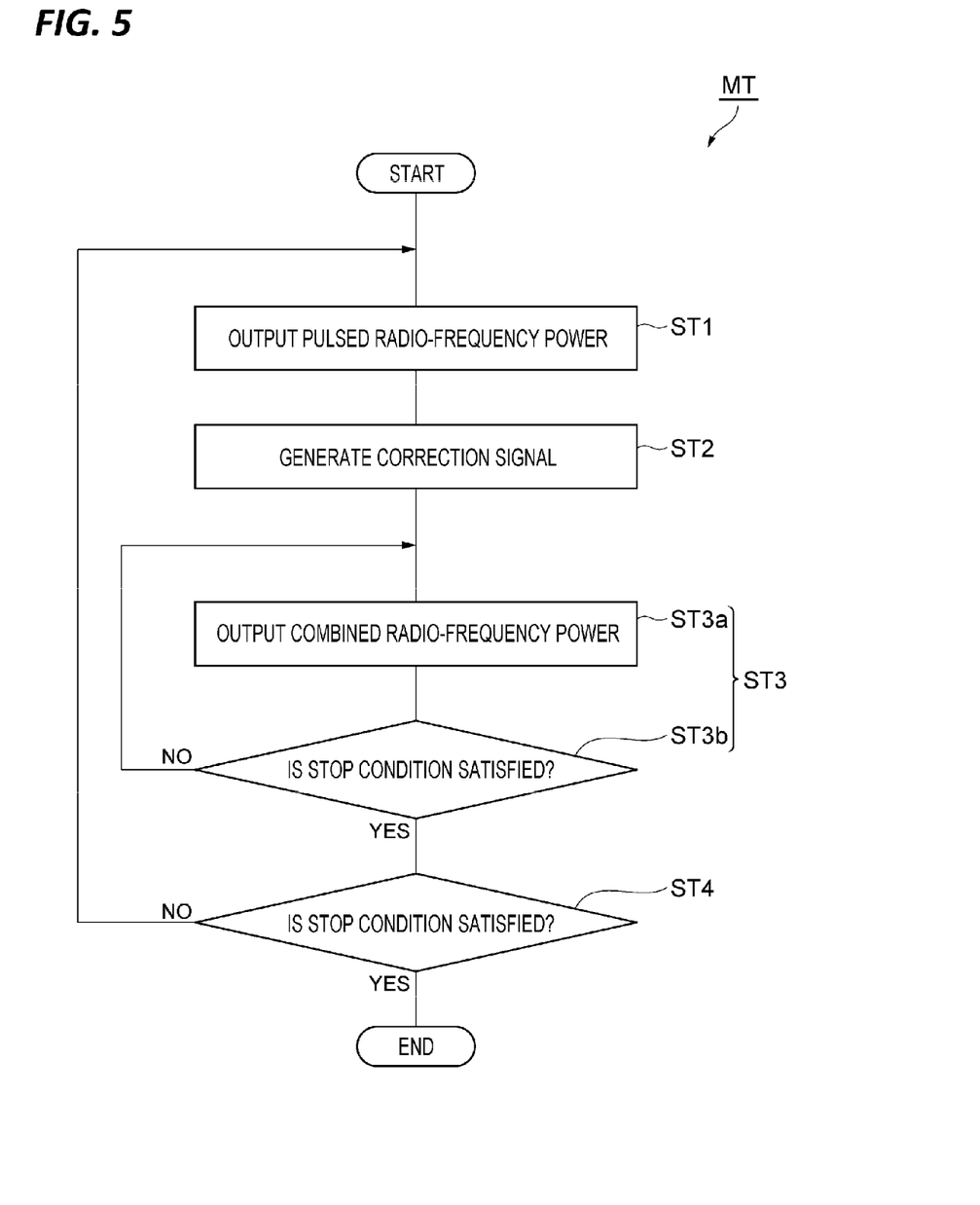
FIG. 5 is a flowchart illustrating a method for generating plasma according to an embodiment.

Hereinafter, a method for generating plasma according to an embodiment will be described with reference to FIG. 5. FIG. 5 is a flowchart illustrating a method for generating plasma according to an embodiment. In the following description, a method MT will be described using the case where the plasma processing apparatus 1 is used as an example. However, the method MT may be performed using another plasma processing apparatus capable of performing the plurality of steps.

The method MT is initiated in step ST1. In step ST1, a pulsed radio-frequency power PHF is output from the radio-frequency power supply 61 in order to generate plasma from gas in the chamber 10. The pulsed radio-frequency power PHF is output in the first period P1.

In step ST2, the correction signal generator 70 generates a correction signal CS. The correction signal CS is a signal that oscillates in a reverse phase with respect to a reflected wave monitor signal MS. The reflected wave monitor signal MS is a signal representing reflected waves of the pulsed radio-frequency power PHF. The reflected wave monitor signal MS is provided to the correction signal generator 70 by the directional coupler 65.

Step ST3 includes step ST3a and step ST3b. In step ST3a, a combined radio-frequency power SHF is output in order to generate plasma from the gas in the chamber 10. The combined radio-frequency power SHF is output in the second period P2. The combined radio-frequency power SHF is a combined power of the pulsed radio-frequency power PHF and a correction radio-frequency power. The correction radio-frequency power is a power that oscillates in a reverse phase with respect to the reflected waves. The combined radio-frequency power SHF is generated using the correction signal CS.

In step ST3b, it is determined whether a stop condition is satisfied. In step ST3b, when the number of times of execution of step ST3a reaches a predetermined number of times, it is determined that the stop condition is satisfied. When it is determined in step ST3b that the stop condition is not satisfied, step ST3a is executed again. Meanwhile, when it is determined in step ST3b that the stop condition is satisfied, step ST4 is executed. When the predetermined number of times is 1, step ST3b is unnecessary.

In step ST4, it is determined whether another stop condition is satisfied. In step ST4, when the number of times of execution of a sequence including step ST1, step ST2, and step ST3 reaches a predetermined number, it is determined that the other stop condition is not satisfied. The predetermined number of times is a plurality of times. When it is determined in step ST4 that the other stop condition is not satisfied, the above sequence is executed again. Meanwhile, when it is determined in step ST4 that the other stop condition is satisfied, the method MT is terminated.

In the method MT, by performing step ST1, a pulsed radio-frequency power PHF is output in the first period P1. By performing step ST3, a combined radio-frequency power SHF is output in each of one or more second periods P2 after the first period P1. Steps ST1 and ST3 are executed such that the output of the pulsed radio-frequency power in the first period P1 and the output of the combined radio-frequency power in the one or more second periods P2 are alternately repeated, as illustrated in FIG. 3.

In the method MT, radio-frequency power LF may be supplied. As described above, each of the first period P1 and the one or more second periods P2 may be synchronized with a corresponding cycle of the radio-frequency power LF.

Although various embodiments have been described above, various omissions, substitutions, and changes may be made without being limited to the embodiments described above. In addition, it is possible to combine elements in different embodiments to form other embodiments.

For example, in another embodiment, the plasma processing apparatus may include only a single radio-frequency power supply that outputs pulsed radio-frequency power, similarly to the radio-frequency power supply 61. The basic frequency of the radio-frequency power output by a single radio-frequency power supply may be any frequency as long as it can generate plasma.

In a still another embodiment, the plasma processing apparatus may be an inductively coupled plasma processing apparatus. In the inductively coupled plasma processing apparatus, the radio-frequency power supply 61 may be electrically connected to an antenna. The antenna creates a magnetic field in the chamber for generating plasma. The antenna may be provided on the ceiling of the chamber. Alternatively, in the inductively coupled plasma processing apparatus, the radio-frequency power supply 61 and the radio-frequency power supply 62 may be connected to the lower electrode, and another radio-frequency power supply may be connected to the antenna.

The plasma processing apparatus of still another embodiment may be a plasma processing apparatus using microwaves for generating plasma. Microwaves may be introduced from an antenna provided on the ceiling of the chamber. In the plasma processing apparatus of this type, the radio-frequency power supply 61 and the radio-frequency power supply 62 are connected to the lower electrode.

In addition, in the plasma processing apparatus 1, as described above, a combined radio-frequency power SHF is generated by amplifying a combined radio-frequency signal AS by the amplifier 61c. In another embodiment, a correction radio-frequency power may be generated by amplifying the correction signal CS by another amplifier. In this case, the combined radio-frequency power SHF is generated by adding the correction radio-frequency power to the pulsed radio-frequency power PHF at the rear stage of the amplifier 61c.

From the foregoing, it should be understood that various embodiments of the present disclosure have been described herein for purpose of illustration, and that various modifications can be made without departing from the scope and spirit of the present disclosure. Accordingly, various embodiments disclosed herein are not intended to be limiting, and the true scope and spirit are indicated by the appended claims.

DESCRIPTION OF SYMBOLS

1: plasma processing apparatus, 10: chamber, 61: radio-frequency power supply, 70: correction signal generator, P1:

first period, P2: second period, PHF: pulsed radio-frequency power, SHF: combined radio-frequency power, CS: correction signal, MS: reflected wave monitor signal.

What is claimed is:

1. An apparatus for plasma processing comprising:
a chamber;
a radio-frequency power supply configured to output a pulsed radio-frequency power or a combined radio-frequency power in order to generate plasma from a gas in the chamber, wherein the combined radio-frequency power is a combined power of the pulsed radio-frequency power with a correction radio-frequency power that oscillates in a reverse phase with respect to a reflected wave of the pulsed radio-frequency power; and
a correction signal generator configured to generate a correction signal that oscillates in a reverse phase with respect to a reflected wave monitor signal representing the reflected wave of the pulsed radio-frequency power,
wherein the radio-frequency power supply is configured to output the pulsed radio-frequency power in a first period,
the correction signal generator is configured to generate the correction signal from the reflected wave monitor signal in the first period, and
the radio-frequency power supply is configured to output the combined radio-frequency power generated using the correction signal in each of one or more second periods after the first period, and alternately repeat output of the pulsed radio-frequency power in the first period and output of the combined radio-frequency power in the one or more second periods.

2. The apparatus according to claim 1, wherein the first period and the one or more second periods are respectively same as a plurality of successive cycles specified by a predetermined frequency.

3. The apparatus according to claim 1, wherein the plasma processing apparatus includes the radio-frequency power supply as a first radio-frequency power supply, and further comprises:
a support stage having a lower electrode and configured to support a substrate thereon in the chamber;
a second radio-frequency power supply electrically connected to the support stage and configured to output another radio-frequency power, wherein a frequency of the another radio-frequency power is lower than a frequency of the pulsed radio-frequency power; and
a synchronization signal generator configured to generate a synchronization signal synchronized with the other radio-frequency power,
wherein the first period and the one or more second periods are respectively same as a plurality of successive cycles of the other radio-frequency power, and
wherein the first radio-frequency power supply is configured to generate the pulsed radio-frequency power in the first period according to the synchronization signal, and generate the combined radio-frequency power in each of the one or more second periods in response to the synchronization signal.

4. The apparatus according to claim 1, further comprising:
a directional coupler provided on an electric path through which the pulsed radio-frequency power output from the radio-frequency power supply and the combined radio-frequency power are transmitted,
wherein the correction signal generator is configured to generate the correction signal from the reflected wave monitor signal output by the directional coupler, wherein the radio-frequency power supply includes:
a radio-frequency signal generator configured to generate a pulsed radio-frequency signal,
an adder configured to add the correction signal to the pulsed radio-frequency signal, thereby generating a combined radio-frequency signal, and
an amplifier configured to amplify the pulsed radio-frequency signal to generate the pulsed radio-frequency power, and amplify the combined radio-frequency signal to generate the combined radio-frequency power, and
wherein the correction signal is not added to the pulsed radio-frequency signal in the first period.

5. The apparatus according to claim 4, wherein the first period and the one or more second periods are respectively same as a plurality of successive cycles specified by a predetermined frequency.

6. The apparatus according to claim 4, wherein the plasma processing apparatus includes the radio-frequency power supply as a first radio-frequency power supply, and further comprises:
a support stage having a lower electrode and configured to support a substrate thereon in the chamber;
a second radio-frequency power supply electrically connected to the support stage and configured to output another radio-frequency power, wherein a frequency of the another radio-frequency power is lower than a frequency of the pulsed radio-frequency power; and
a synchronization signal generator configured to generate a synchronization signal synchronized with the other radio-frequency power,
wherein the first period and the one or more second periods are respectively same as a plurality of successive cycles of the other radio-frequency power, and
wherein the first radio-frequency power supply is configured to generate the pulsed radio-frequency power in the first period according to the synchronization signal, and generate the combined radio-frequency power in each of the one or more second periods in response to the synchronization signal.

7. The apparatus according to claim 4, wherein the correction signal generator is configured to generate the correction signal by generating a reverse phase signal of the reflected wave monitor signal, and correcting the reverse phase signal so as to eliminate a dependency of an amplification factor on an amplitude of an input signal of the amplifier.

8. The apparatus according to claim 7, wherein the first period and the one or more second periods are respectively same as a plurality of successive cycles specified by a predetermined frequency.

9. The apparatus according to claim 7, wherein the apparatus includes the radio-frequency power supply as a first radio-frequency power supply, and further comprises:
a support having a lower electrode and configured to support a substrate thereon in the chamber;
a second radio-frequency power supply electrically connected to the support and configured to output another radio-frequency power, wherein a frequency of the another radio-frequency power is lower than a frequency of the pulsed radio-frequency power; and
a synchronization signal generator configured to generate a synchronization signal synchronized with the other radio-frequency power,
wherein the first period and the one or more second periods are respectively same as a plurality of successive cycles of the other radio-frequency power, and wherein the first radio-frequency power supply is configured to generate the pulsed radio-frequency power in the first period according to the synchronization signal, and generate the combined radio-frequency power in each of the one or more second periods in response to the synchronization signal.

10. A method of generating plasma within a chamber of an apparatus for plasma processing, the method comprising:
outputting a pulsed radio-frequency power in a first period to generate plasma from a gas in the chamber;
generating a correction signal that oscillates in a reverse phase with respect to a reflected wave monitor signal representing a reflected wave of the pulsed radio-frequency power; and
outputting a combined radio-frequency power in each of one or more second periods after the first period to generate plasma from gas in the chamber, wherein the combined radio-frequency power is a combined power of the pulsed radio-frequency power with a correction radio-frequency power that oscillates in a reverse phase with respect to the reflected wave of the pulsed radio-frequency power, the correction radio-frequency power being generated using the correction signal,
wherein the outputting the pulsed radio-frequency power and the outputting the combined radio-frequency power are executed such that output of the pulsed radio-frequency power in the first period and output of the combined radio-frequency power in the one or more second periods are alternately repeated.

* * * * *